United States Patent
Luna et al.

(10) Patent No.: US 8,949,048 B2
(45) Date of Patent: Feb. 3, 2015

(54) PARTIAL DISCHARGE DETECTION APPARATUS SUITABLE FOR DETERMINING WHETHER A PARTIAL DISCHARGE IS OF EXTERNAL OR OF INTERNAL ORIGIN, AND A CORRESPONDING METHOD

(75) Inventors: Gilbert Luna, Villepinte (FR); Sébastien Louise, Choisy le Roi (FR)

(73) Assignee: Alstom Technology Ltd. (CH)

( * ) Notice: Subject to any disclaimer, the term of this patent is extended or adjusted under 35 U.S.C. 154(b) by 669 days.

(21) Appl. No.: 13/319,278

(22) PCT Filed: May 10, 2010

(86) PCT No.: PCT/EP2010/056330
§ 371 (c)(1),
(2), (4) Date: Feb. 17, 2010

(87) PCT Pub. No.: WO2010/130671
PCT Pub. Date: Nov. 18, 2010

(65) Prior Publication Data
US 2012/0143533 A1    Jun. 7, 2012

(30) Foreign Application Priority Data

May 13, 2009   (FR) ...................................... 09 53146

(51) Int. Cl.
*G01R 31/00*    (2006.01)
*G01R 31/08*    (2006.01)
*G01R 21/00*    (2006.01)
*G01R 31/02*    (2006.01)
*G01R 31/12*    (2006.01)

(52) U.S. Cl.
CPC ............ *G01R 31/086* (2013.01); *G01R 31/027* (2013.01); *G01R 31/1272* (2013.01)
USPC ..................... 702/59; 702/60; 702/61; 702/62

(58) Field of Classification Search
CPC ..... G01R 31/086; G01R 31/12; G01R 31/027
USPC ....................................... 702/59–70
See application file for complete search history.

(56) References Cited

U.S. PATENT DOCUMENTS

| | | | | |
|---|---|---|---|---|
| 5,075,629 | A * | 12/1991 | Umemura et al. ............ | 324/547 |
| 5,804,972 | A | 9/1998 | de Kock et al. | |
| 6,323,655 | B1 | 11/2001 | Fu et al. | |
| 7,208,958 | B2 | 4/2007 | Raja | |
| 8,008,926 | B2 * | 8/2011 | Park et al. ..................... | 324/536 |
| 2002/0024341 | A1 | 2/2002 | Rokunohe et al. | |
| 2012/0143533 | A1 * | 6/2012 | Luna et al. ..................... | 702/59 |

FOREIGN PATENT DOCUMENTS

| | | |
|---|---|---|
| EP | 0984289 | 3/2000 |
| FR | 2851852 | 2/2003 |

* cited by examiner

*Primary Examiner* — Phuong Huynh
(74) *Attorney, Agent, or Firm* — Baker Hostetler LLP

(57) ABSTRACT

The invention relates to detection apparatus for detecting a partial discharge from live electrical apparatus, the detection apparatus comprising detection means (Pc) mounted on the live electrical apparatus (T) for the purpose of detecting the occurrence of at least one partial discharge, wherein said detection apparatus further comprises additional means (D1, D2, S) suitable for determining whether a detected partial discharge is internal or external relative to the live apparatus.

9 Claims, 7 Drawing Sheets

PARTIAL DISCHARGE DETECTION APPARATUS SUITABLE FOR DETERMINING WHETHER A PARTIAL DISCHARGE IS OF EXTERNAL OR OF INTERNAL ORIGIN, AND A CORRESPONDING METHOD

TECHNICAL FIELD AND PRIOR ART

The invention relates to apparatus for detecting a partial discharge from a live electrical apparatus. The apparatus of the invention is suitable for determining whether a detected partial discharge is internal or external relative to the live electrical apparatus.

The invention also relates to a method of detecting a partial discharge from a live electrical apparatus, which method is suitable for determining whether a detected partial discharge is internal or external relative to the live electrical apparatus.

Partial discharge measured during factory acceptance testing of power transformers is a criterion making it possible to ensure that the transformers are operating properly. Depending on the conditions in the environment of the transformer under test, that measurement can be highly disturbed, and therefore falsified, by external sources of discharge. Such environment conditions are described in Standard IEC 60 270 (2000), Annex G, page 9.

A technical problem to be solved is making it possible to determine whether partial discharges that are measured on a live transformer originate from sources external to the transformer or from the transformer itself. That problem is even more acute during on-site testing because the external disturbances are more difficult to control.

Various methods exist for identifying the origin of partial discharges.

For example, external partial discharges can be identified by using an ultrasound detector or by using an ultraviolet camera. For ultrasound detectors, one problem lies in the fact that they are also sensitive to external noise other than the noise due to partial discharges. As a result, detecting partial discharges by using ultrasound sources is not reliable. As regards ultraviolet cameras, one problem lies in the fact that such cameras make it possible to locate only partial discharges of the corona type, i.e. discharge by ionizing air. They do not make it possible to detect partial discharges having other origins, such as, for example, partial discharges due to electronic elements switching. Furthermore, the equipment required with such ultraviolet cameras is very expensive, which is another drawback.

It is also known that partial discharges that are internal to electrical equipment can be detected by means of Ultra High Frequency (UHF) antennas placed inside such electrical equipment. Patent Document U.S. Pat. No. 5,804,972 entitled "Partial-Discharge Measuring Device" thus discloses a device for detecting partial discharges that are internal to electrical equipment. That device uses a UHF antenna installed inside the electrical equipment. Patent Documents U.S. Pat. No. 6,323,655 and FR 2 851 852 also disclose detection of internal partial discharges by means of a UHF antenna.

A problem with partial discharge detection as described in Patent Documents U.S. Pat. No. 5,804,972, U.S. Pat. No. 6,323,655, and FR 2 851 852 lies in the fact that, in certain circumstances, a partial discharge can be detected even though that partial discharge is not an internal discharge, but rather it is an external discharge. This applies, for example, for external discharges of very high intensity that occur during electrical switching or commutation of electrical members (motor control, poor contacts at brushes of motors or variable transformers).

An object of the invention is to provide partial discharge detection apparatus and a partial discharge detection method that do not suffer from that drawback.

SUMMARY OF THE INVENTION

To this end, the invention provides detection apparatus for detecting a partial discharge from a live electrical equipment tank, the detection apparatus comprising detection means placed in contact with the live electrical equipment and suitable for detecting the occurrence of a partial discharge that is internal or external relative to the tank, said detection apparatus being characterized in that it comprises:

a first UHF measurement system that includes a first UHF sensor inserted completely or partly into the tank and that delivers a UHF signal whenever a partial discharge occurs that is internal or external relative to the tank;

a second UHF measurement system that is substantially identical to the first UHF measurement system and that includes a second UHF sensor placed at a distance from the tank and that delivers a UHF signal whenever a partial discharge occurs that is external relative to the tank; and an acquisition system that comprises:
acquisition means for acquiring, in a frequency band, background noise BF1 delivered by the first UHF measurement system and background noise BF2 delivered by the second UHF measurement system;
search means for seeking steep fronts in a first UHF signal delivered by the first measurement system and in a second UHF signal delivered by the second measurement system, whenever any partial discharge is detected by the detection means;
determination means for determining a maximum amplitude of the first UHF signal and a maximum amplitude of the second UHF signal if a steep front is detected in the first UHF signal and/or the second UHF signal;
determination means for determining, in the frequency band, a first signal-to-noise ratio R1 relating to the first UHF signal and a second signal-to-noise ratio R2 relating to the second UHF signal;
comparator means for comparing the ratios R1 and R2; and
computation means suitable for deciding whether a detected partial discharge is internal or external relative to the tank, as a function of the result delivered by the comparison step.

To this end, the invention also provides a detection method of detecting a partial discharge from a live electrical equipment tank, the method comprising a detection step of detecting the occurrence of a partial discharge that is internal or external relative to the tank by means of detection means in contact with the electrical equipment, said method being characterized in that it comprises:

an acquisition step of acquiring, in a frequency band, background noise BF1 delivered by a first UHF measurement system that includes a first UHF sensor inserted completely or partly into the tank;

an acquisition step of acquiring, in a frequency band, background noise BF2 delivered by a second UHF measurement system that is substantially identical to the first measurement system and that includes a sensor placed at a distance from the tank;

a measurement step of measuring a UHF signal using the first measurement system whenever a partial discharge occurs that is internal or external relative to the tank;

a measurement step of measuring a UHF signal using the second measurement system whenever a partial discharge occurs that is external relative to the tank; and an acquisition step that comprises:

a search step of seeking steep fronts in the first UHF signal delivered by the first measurement system and in a second UHF signal delivered by the second measurement system, whenever any partial discharge is detected by the measuring means;

a determination step of determining a maximum amplitude A(UHF1) of the first UHF signal and a maximum amplitude A(UHF2) of the second UHF signal if a steep front is detected in the first UHF signal and/or the second UHF signal.

a determination step of determining, in the frequency band, a first signal-to-noise ratio R1 relating to the first UHF signal and a second signal-to-noise ratio R2 relating to the second UHF signal;

a comparison step of comparing the ratios R1 and R2; and a computation step suitable for deciding whether a detected partial discharge is internal or external relative to the tank, as a function of the result delivered by the comparison step.

In an additional characteristic of the invention, the computation means suitable for deciding whether a detected partial discharge is internal or external relative to the live apparatus include comparator means for comparing a first instant at which the first UHF signal was detected with a second instant at which the second UHF signal was detected, any partial discharge detected being considered as being external to the live apparatus if, when the ratio R1/R2 lies substantially in the range 1.3 to 0.7, the first instant is substantially equal to the second instant. The term "first instant substantially equal to the second instant" should be understood as designating two instants separated by 5 nanoseconds (ns) or less.

For example, the acquisition system is a computer (microcomputer, microprocessor, etc.) or an oscilloscope.

The method of the invention is advantageously suitable for safely and reliably determining whether a detected partial discharge is of internal or of external origin.

The frequency band in which the UHF detectors detect is, for example, the band 200 MHz to 1000 MHz.

BRIEF DESCRIPTION OF THE FIGURES

Other characteristics and advantages of the invention appear from the description of preferred embodiments given with reference to the accompanying figures, in which.

In all of the figures, like references designate like elements.

DETAILED DESCRIPTION OF EMBODIMENTS OF THE INVENTION

Figure 1:
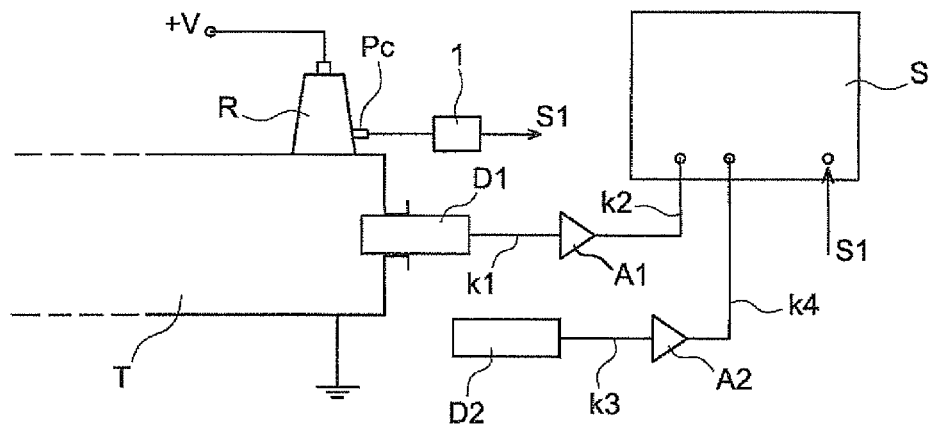
FIG. 1 shows a first embodiment of partial discharge detection apparatus in a first variant of the invention.

FIG. 1 shows a first embodiment of partial discharge detection apparatus in a first variant of the invention. The live electrical apparatus is, for example, a transformer tank T under a voltage +V.

The apparatus comprises three partial discharge measurement systems and an acquisition system S. A first measurement system comprises a bushing capacitive tap Pc and a first signal-shaping circuit 1 in series with the capacitive tap. The first measurement system constitutes partial discharge measurement means that comply with Standard IEC 60270. In a manner known per se, the bushing capacitive tap Pc taps the partial discharge signals at a bushing R of the transformer T, and the circuit 1 that shapes the signal tapped by the capacitive tap delivers a signal S1 that is transmitted to the acquisition system S. A second measurement system is made up of a UHF sensor D1, of a preamplifier A1 in series with the sensor D1, and of connection cables k1, k2, the cable k1 connecting the sensor D1 to the preamplifier A1, and the cable k2 connecting the preamplifier A1 to the acquisition system S. For example, the sensor D1 works in the frequency band [200 megahertz (MHz) to 1000 MHz]. For example, the sensor D1 is as described in French Patent Document No. 2 851 852, i.e. an antenna formed of two electrodes separated by a dielectric resonator that is placed in an emptying valve of the transformer T, i.e. inserted in a wall of the transformer tank. The signal delivered by the sensor D1 is amplified by the preamplifier A1 and the signal delivered by the preamplifier A1 is transmitted to the acquisition system S. The third measurement system comprises a UHF sensor D2, a preamplifier A2 in series with the sensor D2, and connection cables k3, k4, the cable k3 connecting the sensor D2 to the preamplifier A2, and the cable k4 connecting the preamplifier A2 to the acquisition system S. The third measurement system is substantially identical to the second measurement system. The term "substantially identical" as applied to the measurement systems should be understood to mean that the measurement systems in question are suitable for delivering, at the same time and under the same measurement conditions, two signals that are of substantially identical amplitudes following detection of partial discharges of the same intensity. In particular, the UHF sensors D1 and D2 are identical sensors. The third UHF measurement system is placed at a distance from the transformer tank.

The acquisition system S is made up of circuits that trigger processing of the measurements delivered by the second and third measurement systems whenever any partial discharge is detected by the capacitive tap Pc (transmission of a signal S1 to the acquisition system S). For example, the acquisition system S is an oscilloscope.

Figure 2:
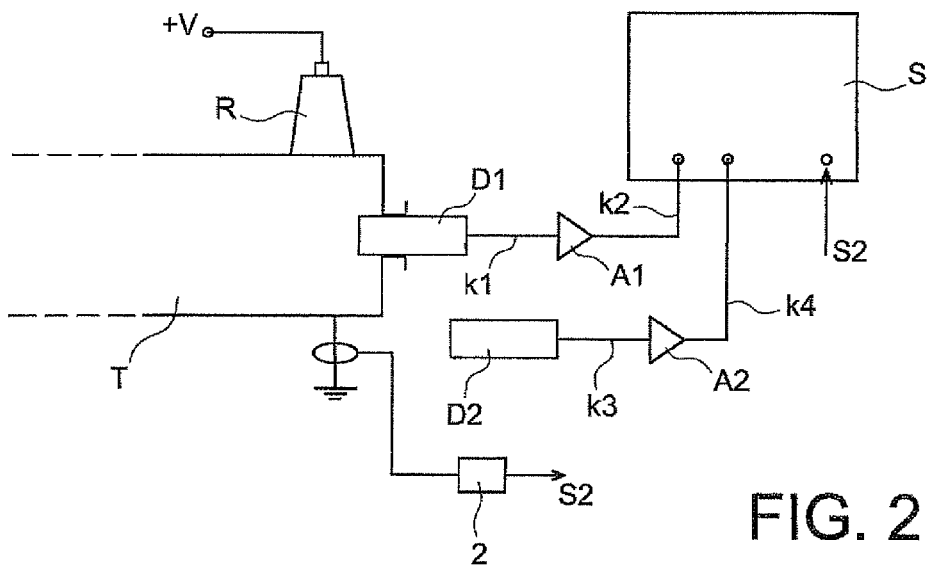
FIG. 2 shows a second embodiment of partial discharge detection apparatus in the first variant of the invention.

FIG. 2 shows a second embodiment of partial discharge detection apparatus of the first variant of the invention. The apparatus also comprises three partial discharge measurement systems and an acquisition system S. A first partial discharge measurement system comprises a current clamp meter Pa that is broadband and high-frequency (e.g. up to 100 MHz) and a signal-shaping circuit 2 for shaping the signal detected by the clamp meter. Said first measurement system constitutes partial discharge measurement means that comply with Standard IEC 60270. In a manner known per se, the clamp meter Pa taps the discharge signals from a grounding return of the transformer (reference potential of the transformer) and the circuit 2 that shapes the signal delivered by the clamp meter Pa delivers a signal S2 that is transmitted to the acquisition system S. The other two partial discharge measurement systems are identical to the measurement systems mentioned for the first embodiment. They are positioned in the same way as described above. The acquisition system S is made up of processor circuits that trigger processing of the measurements delivered by the second and third measurement systems whenever any partial discharge is detected by the clamp meter Pa (transmission of a signal S2 to the acquisition system S). For example, the acquisition system S is an oscilloscope.

Figure 3:
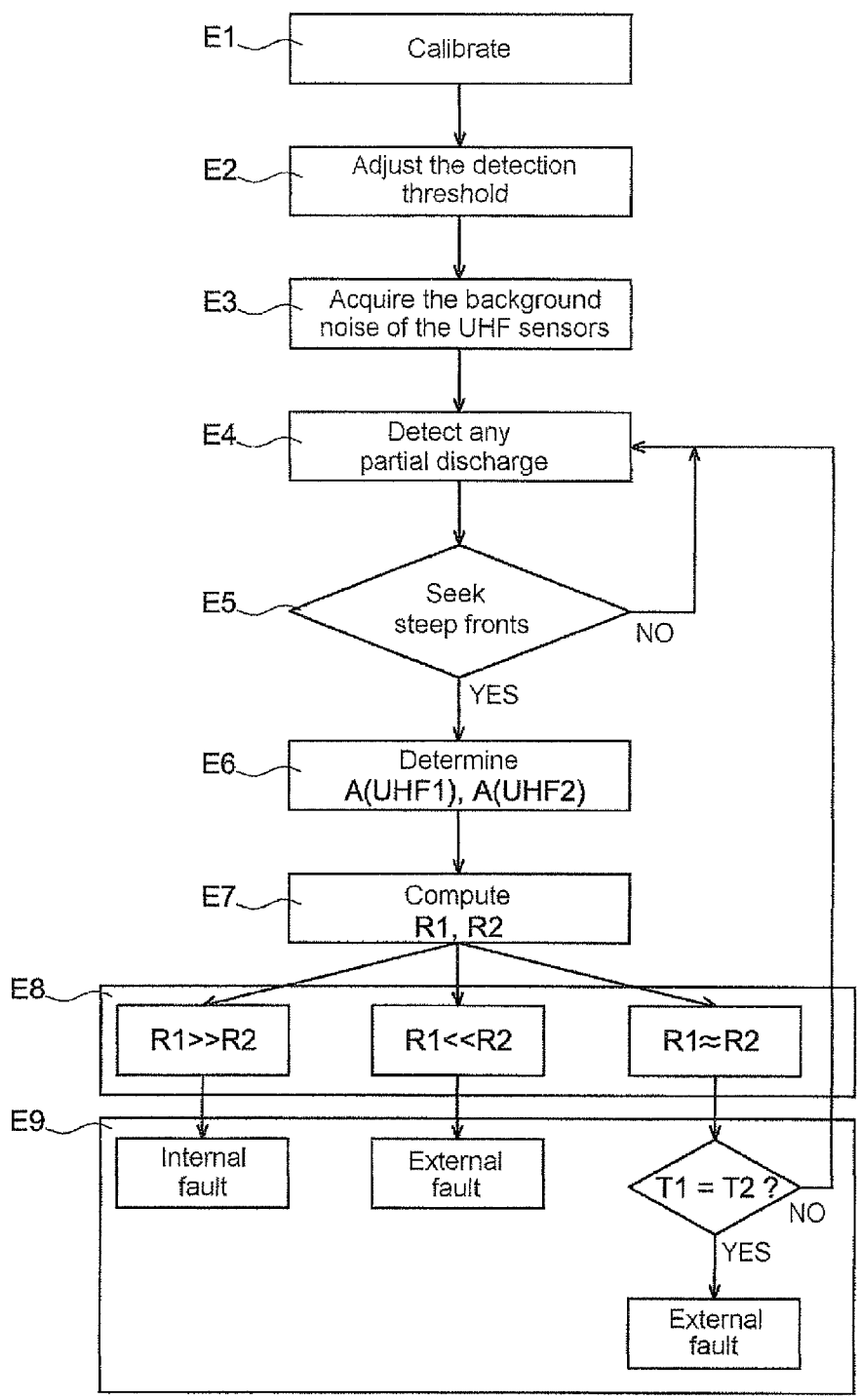
FIG. 3 is a flow chart of the partial discharge detection method in the first variant of the invention.

FIG. 3 shows a flow chart of the partial discharge detection method in the first variant of the invention. The method of the first variant of the invention is implemented by the apparatus shown in FIG. 1 or by the apparatus shown in FIG. 2.

The method comprises a step E1 of calibrating the detection apparatus, a step E2 of adjusting the detection threshold of the measurement system that comprises the measurement means that comply with Standard IEC 60270, a step E3 of acquiring by means of the acquisition system S, over a given frequency band, background noise delivered by the measurement systems that include the UHF sensors D1 and D2, a step E4 of detecting a partial discharge by means of the measurement system that comprises the measurement means that comply with Standard IEC 60270, and, as soon as a partial discharge is detected at step E4, a step E5 of seeking steep fronts in the signals delivered by the measurement systems that include the UHF sensors D1 and D2, a step E6 of determining the maximum amplitude of each of the signals detected by the measurement systems that include the UHF sensors D1 and D2 if steep fronts are detected in step E5 on one and/or the other of the signals detected by the measurement systems which comprise the sensors D1 and D2, a step E7 of computing a first signal-to-noise ratio R1 relating to the UHF signal detected by the sensor D1 and a second signal-to-noise ratio R2 relating to the UHF signal detected by the sensor D2, a step E8 of comparing the two ratios R1 and R2, and a step E9 of taking a decision that determines whether the partial discharge is of internal or of external origin as a function of the results of the comparison.

During the calibration step E1, a calibrated electrical signal representing a partial discharge in compliance with Standard IEC 60270 is injected, in a manner known per se, at the bushing R of the live transformer. Adjusting the detection threshold during the step E2 consists, in a manner known per se, in defining a signal level above which any partial discharge must be taken into account. The step E3 of acquiring the background noise consists, in a manner known per se, in measuring the noise level detected by the measurement systems provided with UHF sensors in a frequency band equal, for example, to [200 MHz to 1000 MHz]. The noise BF1 and the noise BF2 measured respectively on the measurement system that includes the UHF sensor D1 and on the measurement system that includes the UHF sensor D2 are put into a memory in the acquisition system S. The steps E2 and E3 can be performed simultaneously or at different times. When the measurement system that includes the capacitive tap Pc or the clamp meter Pa detects a partial discharge (step E4), the step E5 for seeking steep fronts in the signals delivered by the UHF measurement systems is launched. A steep front is indicative of the appearance of a partial discharge. Thus, a steep front being obtained during the step E5 confirms appearance of such a discharge. For example, steep fronts are sought, in a manner known per se, by the method described in French Patent Document No. 2 883 979 ("Procédé de détection de la position d'un front d'onde dans un signal reçu par un détecteur" ["Method of Detecting the Position of a Wave Front in a Signal Received by a Detector"]). If no steep front is detected in one of the two UHF measurement systems, it is considered that no partial discharge has been emitted, and the detection apparatus is put back into the state in which it is awaiting a partial discharge. Conversely, if a steep front is detected in either one of or in both of the UHF measurement systems, the step E6 determines the maximum amplitude A(UHF1) of the signal detected by the sensor D1 and the maximum amplitude A(UHF2) of the signal detected by the sensor D2. Then, the step E7 computes the signal-to-noise ratios R1 and R2 such that:

$$R1 = A(UHF1)/BF1; \text{ and}$$

$$R2 = A(UHF2)/BF2.$$

The ratio R1 or R2 takes the value 1 if the corresponding UHF measurement system has not detected any partial discharge.

The step E7 of computing the magnitudes R1 and R2 is succeeded by the step E8 of comparing the magnitudes R1 and R2. Various situations occur that can resemble one another in three possibilities:

$$R1 \gg R2;$$

$$R2 \gg R1;$$

R1≈R2 (R1≈R2 corresponds not only to the situation in which the ratios R1 and R2 are substantially equal, but also to the situation in which their ratio R1/R2 lies in a range defined in advance, e.g.: 1.3>R1/R2>0.7).

The decision step E9 succeeds the comparison step E8. In the situation in which R1≫R2, i.e. it is a fault internal to the apparatus that is diagnosed, and in the situation in which R2≫R1, it is an external fault that is diagnosed. In the situation in which R1 and R2 are not very different from each other (e.g. 1.3>R1/R2>0.7), an additional computation is performed for comparing the instants at which the signals were detected by the UHF measurement systems. If the instants T1 and T2 at which the sensors D1 and D2 detected the signals are almost identical, a fault that is external to the transformer is diagnosed. Otherwise no partial discharge is diagnosed and the detection apparatus is put back into the state in which it is awaiting a partial discharge. The term "almost identical" as applied to detection instants should be understood as designating, for example, two instants separated by 5 nanoseconds (ns) or less. The steps E5-E9 are implemented by the acquisition system S.

Figure 4:
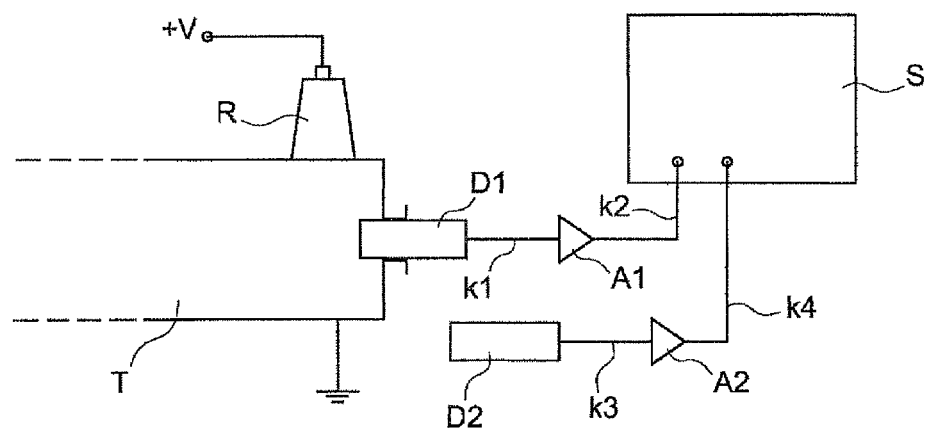
FIG. 4 shows partial discharge detection apparatus in a second variant of the invention.
Figure 5:
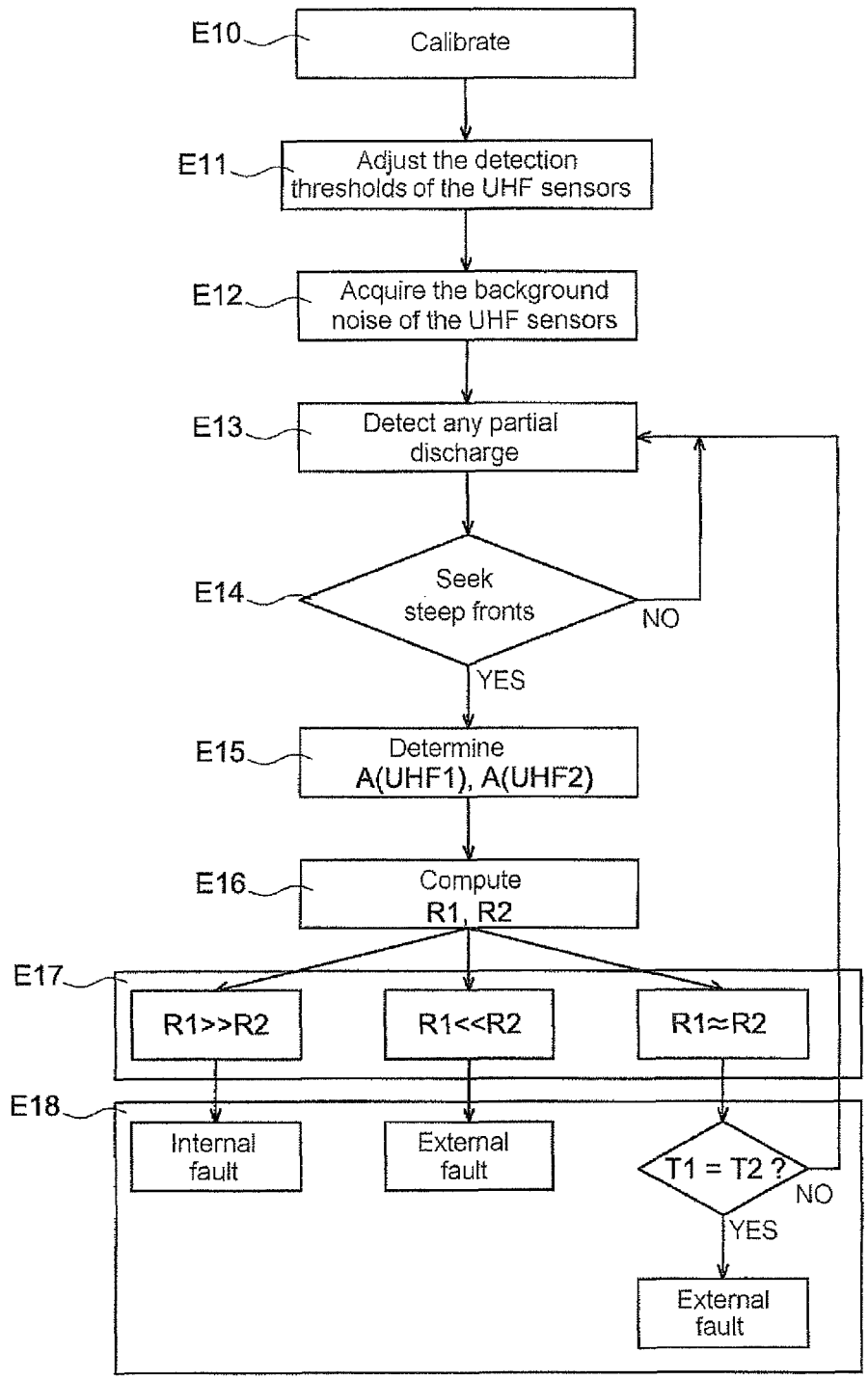
FIG. 5 is a flow chart of the partial discharge detection method in the second variant of the invention.

FIG. 4 shows partial discharge detection apparatus in the second variant of the invention.

In the second variant of the invention, the partial discharge detection apparatus comprises only the two UHF measurement systems and the acquisition system S. The partial discharges are then no longer detected by one of the measurement means that comply with Standard IEC 60270 as applies in the first variant of the invention, but rather by the UHF measurement system having a sensor D1 mounted on the transformer. In this variant, the detection method comprises a step E10 of calibrating the detection apparatus, a step E11 of adjusting the detection thresholds of the UHF measurement systems, a step E12 of acquiring, over a given range of frequencies, background noise delivered by the measurement systems UHF, a step E13 of detecting a partial discharge by means of the UHF measurement system which comprises the sensor D1 and, as soon as a partial discharge is detected during the step E13, a step E14 of seeking steep fronts in signals delivered by the two UHF measurement systems, a step E15 of determining the maximum amplitude of each of the signals detected by the UHF measurement systems if steep fronts are detected in step E14 on one and/or the other of the signals detected by the measurement systems which comprise the sensors D1 and D2, a step E16 of computing a first signal-to-noise ratio R1 relating to the UHF signal detected by the sensor D1 and a second signal-to-noise ratio R2 relating to the UHF signal detected by the sensor D2, a step E17 of comparing the two ratios R1 and R2, and a step E18 of taking a decision that determines whether the partial discharge is of internal or of external origin as a function of the results of the comparison. In this variant, the step E14 of seeking steep fronts is triggered by the partial discharge detection signal that is delivered by the UHF sensor D1 that is mounted on the transformer.

Figure 6A:
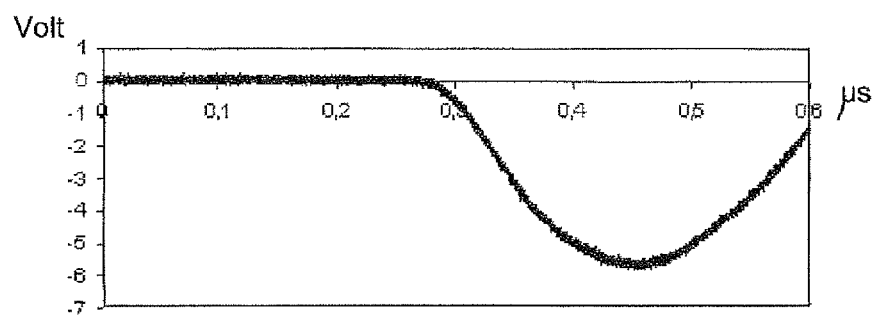
FIGS. 6A-6C show measurement curves obtained by the method in the first variant of the invention, for detecting a partial discharge internal to the apparatus.
Figure 6B:
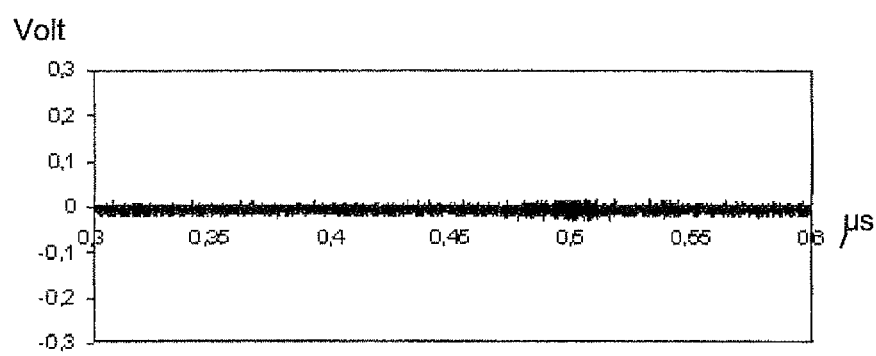
Figure 6C:
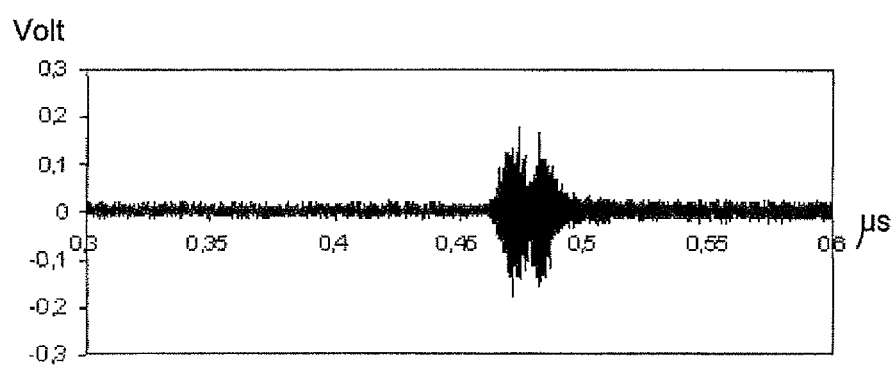

By way of example, FIGS. 6A-6C show measurement curves in volts per microsecond (V/µs) obtained by the method of the first variant of the invention, for detecting partial discharge internal to the live electrical apparatus. The curve 6A represents the signal measured by a capacitive tap Pc, and FIGS. 6B and 6C respectively represent the signal measured by the UHF sensor D1 and the signal measured by the UHF sensor D2 (absence of signal). In this situation, only the sensor D1 detects a partial discharge, thereby indicating that said partial discharge is of internal origin.

Figure 7A:
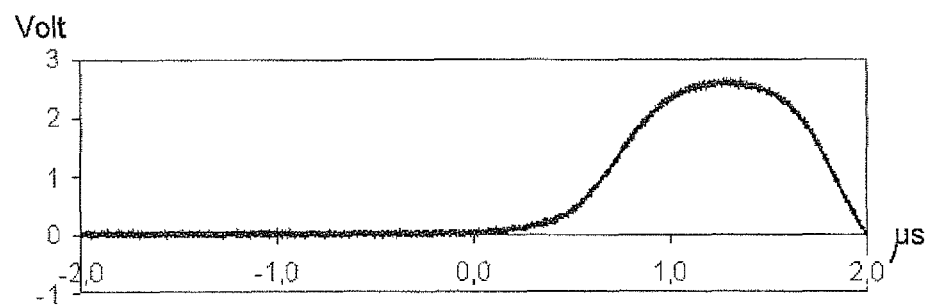
FIGS. 7A-7C and 8A-8B show measurement curves obtained by the method in the first variant of the invention, for detecting a partial discharge external to the apparatus.
Figure 7B:
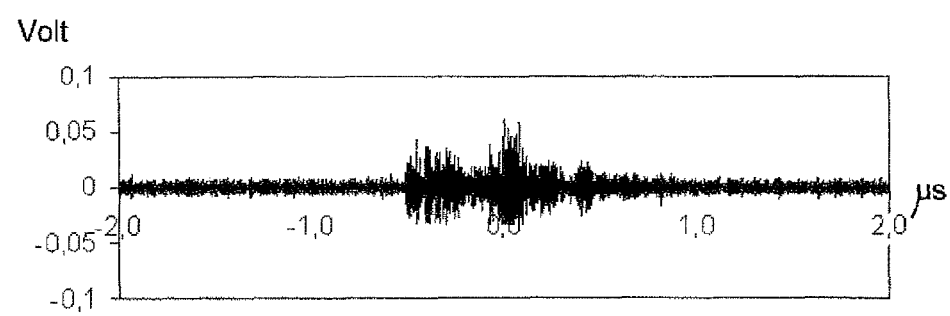
Figure 7C:
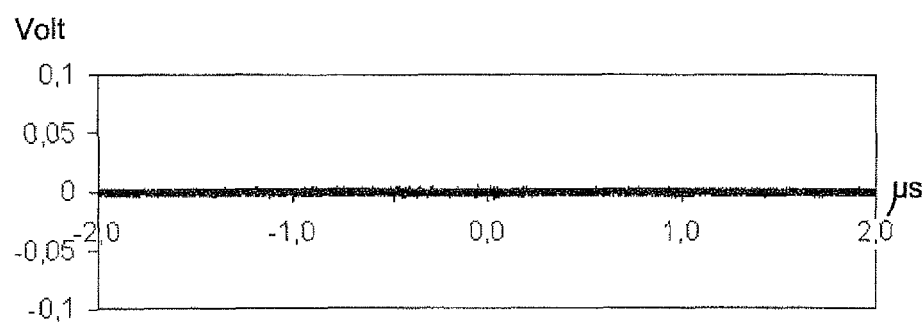
Figure 8A:
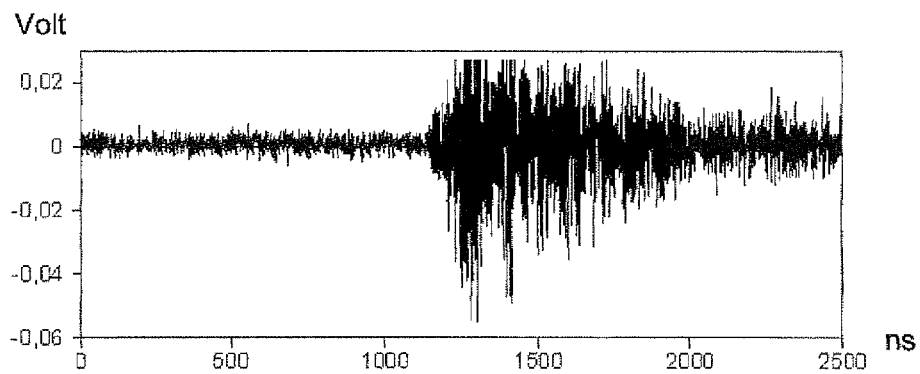
Figure 8B:
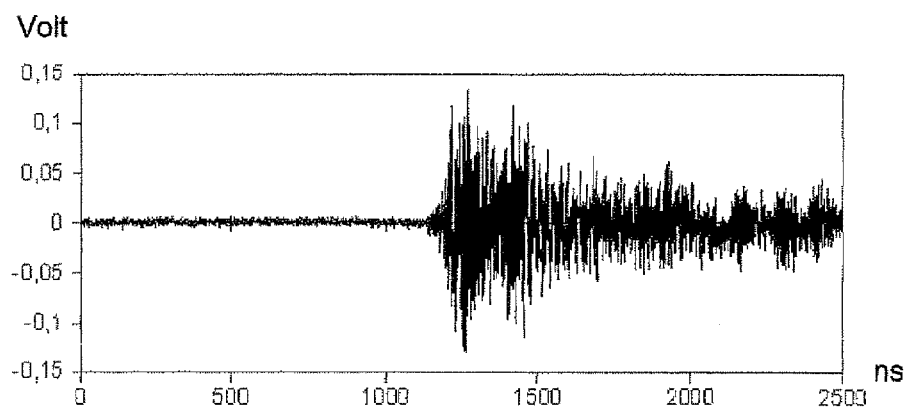

By way of example, FIGS. 7A-7C and 8A-8B show measurement curves obtained by using the method of the first variant of the invention, for detecting a partial discharge that is external to the live electrical apparatus. The curves of FIGS. 7A-7C are in V/µs and the curves of FIGS. 8A-8B are in V/ns.

FIG. 7A shows the signal measured by a capacitive tap Pc mounted on the electrical apparatus, and FIGS. 7B and 7C respectively show the signal measured by the UHF sensor D2 and the signal measured by the UHF sensor D1 (absence of signal). In this situation, only the UHF sensor D2 detects a partial discharge, thereby indicating that said partial discharge is of external origin.

FIGS. 8A and 8B show signals measured simultaneously by the UHF sensors D1 and D2. In this situation, the two UHF sensors measure signals of substantially identical amplitudes that are detected substantially at the same instant. The term "signals detected substantially at the same instant" should be understood as designating signals having respective detection instants T1 and T2 that are, for example, separated by 5 nanoseconds or less. The calculation of the signal-to-noise ratios R1 and R2 thus leads to values that are substantially equal. The instants T1 and T2 at which the signals are detected are then compared and, as a result of the almost-simultaneous nature of these instants, it is deduced that the partial discharge is of external origin.

The invention claimed is:

1. Detection apparatus for detecting a partial discharge from a live electrical equipment tank (T), the detection apparatus comprising detection means (Pc, Pa, D1) placed in contact with the live electrical equipment (T) and suitable for detecting the occurrence of a partial discharge that is internal or external relative to the tank, said detection apparatus being characterized in that it comprises:
   a first ultra high frequency ("UHF"), measurement system (D1, A1) that includes a first UHF sensor (D1) inserted completely or partly into the tank and that delivers a UHF signal whenever a partial discharge occurs that is internal or external relative to the tank;
   a second ultra high frequency ("UHF") measurement system (D2, A2) that is substantially identical to the first UHF measurement system and that includes a second UHF sensor (D2) placed at a distance from the tank and that delivers a UHF signal whenever a partial discharge occurs that is external relative to the tank; and
   an acquisition system (S) that comprises:
      acquisition means for acquiring, in a frequency band, background noise BF1 delivered by the first UHF measurement system and background noise BF2 delivered by the second UHF measurement system;
      search means for seeking steep fronts in a first UHF signal delivered by the first measurement system and in a second UHF signal delivered by the second measurement system, whenever any partial discharge is detected by the detection means;
      determination means for determining a maximum amplitude A(UHF1) of the first UHF signal and a maximum amplitude A(UHF2) of the second UHF signal if a steep front is detected in the first UHF signal and/or the second UHF signal;
      determination means (E3, E6, E7; E12, E15, E16) for determining, in the frequency band, a first signal-to-noise ratio R1 relating to the first UHF signal and a second signal-to-noise ratio R2 relating to the second UHF signal;
      comparator means (E8, E17) for comparing the ratios R1 and R2; and
      computation means (E9, E18) suitable for deciding whether a detected partial discharge is internal or external relative to the tank, as a function of the result delivered by the comparison step.

2. Apparatus according to claim 1, wherein the tank is a tank of a live transformer, and the detection means mounted on the live electrical apparatus for the purpose of detecting a detected partial discharge are constituted by a bushing capacitive tap (Pc) that taps partial discharge signals at a bushing (R) of the transformer.

3. Apparatus according to claim 1, wherein the tank is a tank of a live transformer, and the detection means mounted on the live electrical apparatus for the purpose of detecting a detected partial discharge are constituted by a high-frequency clamp meter (Pa) that taps partial discharge signals from a grounding return of the transformer.

4. Apparatus according to claim 1, wherein the detection means in contact with the live electrical equipment are constituted by the first UHF sensor (D1) of the first measurement system.

5. Apparatus according to claim 1, wherein the computation means suitable for deciding whether a detected partial discharge is internal or external relative to the live apparatus include comparator means for comparing a first instant (T1) at which the UHF signal was detected with a second instant (T2) at which the second UHF signal was detected, any partial discharge detected being considered as being external to the live apparatus if, when the ratio R1/R2 lies substantially in the range 1.3 to 0.7, the first instant (T1) is substantially equal to the second instant (T2).

6. Apparatus according to claim 1, wherein the frequency band is the band 200 MHz to 1000 MHz.

7. Apparatus according to claim 1, wherein the first UHF sensor (D1) and the second UHF sensor (D2) are each constituted by an electromagnetic antenna formed by electrodes separated by a dielectric resonator.

8. A detection method for detecting a partial discharge from a live electrical equipment tank, the method comprising a detection step (E4, E13) of detecting the occurrence of a partial discharge that is internal or external relative to the tank by means of detection means in contact with the electrical equipment, said method being characterized in that it comprises:

an acquisition step of acquiring, in a frequency band, background noise BF1 delivered by a first ultra high frequency ("UHF") measurement system that includes a first UHF sensor inserted completely or partly into the tank;

an acquisition step of acquiring, in a frequency band, background noise BF2 delivered by a second UHF measurement system that is substantially identical to the first measurement system and that includes a sensor placed at a distance from the tank;

a measurement step of measuring a UHF signal (E4, E13) using the first measurement system whenever a partial discharge occurs that is internal or external relative to the tank;

a measurement step of measuring a UHF signal (E4, E13) using the second measurement system whenever a partial discharge occurs that is external relative to the tank; and an acquisition step (E5, E6, E7, E8, E9; E14, E15, E16, E17, E18) that comprises:
  a search step of seeking steep fronts (E5, E14) in the first UHF signal delivered by the first measurement system and in a second UHF signal delivered by the second measurement system, whenever any partial discharge is detected by the measuring means;
  a determination step of determining a maximum amplitude A(UHF1) of the first UHF signal and a maximum amplitude A(UHF2) of the second UHF signal if a steep front is detected in the first UHF signal and/or the second UHF signal;
  a determination step (E3, E6, E7; E12, E15, E16) of determining, in the frequency band, a first signal-to-noise ratio R1 relating to the first UHF signal and a second signal-to-noise ratio R2 relating to the second UHF signal;
  a comparison step (E8, E17) of comparing the ratios R1 and R2; and
  a computation step (E9, E18) suitable for deciding whether a detected partial discharge is internal or external relative to the tank, as a function of the result delivered by the comparison step.

9. A method according to claim 8, wherein the computation step (E9, E18) suitable for deciding whether a detected partial discharge is internal to or external to the live electrical apparatus, as a function of the result delivered by the comparison step, consists in comparing a first instant (T1) at which the first UHF signal was detected with a second instant (T2) at which the second UHF signal was detected, the detected partial discharge being considered as being external to the live apparatus if, when the ratio R1/R2 lies substantially in the range 1.3 to 0.7, the first instant (T1) is substantially equal to the second instant (T2).

* * * * *